United States Patent
Russell et al.

(10) Patent No.: US 6,829,143 B2
(45) Date of Patent: Dec. 7, 2004

(54) HEATSINK RETENTION APPARATUS

(75) Inventors: Mark C. Russell, Graham, WA (US); Ron Flamm, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/251,673

(22) Filed: Sep. 20, 2002

(65) Prior Publication Data

US 2004/0057212 A1 Mar. 25, 2004

(51) Int. Cl.[7] ................................................. H05K 7/20
(52) U.S. Cl. ........................ 361/704; 361/709; 361/712; 257/714; 165/80.3
(58) Field of Search .......................... 411/909; 248/505, 248/510; 403/404, 408.1; 267/150, 158, 160; 361/703–705, 709–712, 717–719, 720; 257/718, 719, 722, 726, 727; 174/16.3; 165/80.3, 185, 453, 457, 458

(56) References Cited

U.S. PATENT DOCUMENTS

| | | | | |
|---|---|---|---|---|
| 5,010,949 A | * | 4/1991 | Dehaine ........................ | 165/76 |
| 5,710,694 A | * | 1/1998 | Chen ........................... | 361/703 |
| 5,730,210 A | * | 3/1998 | Kou ............................ | 165/80.3 |
| 5,754,400 A | * | 5/1998 | Sathe et al. .................. | 361/704 |
| 5,999,402 A | * | 12/1999 | Jeffries et al. ............... | 361/687 |
| 6,101,096 A | * | 8/2000 | MacGregor et al. ......... | 361/720 |
| 6,400,577 B1 | * | 6/2002 | Goodwin et al. ............ | 361/816 |
| 6,475,030 B1 | * | 11/2002 | Chang ......................... | 439/557 |
| 6,480,387 B1 | * | 11/2002 | Lee et al. .................... | 361/704 |
| 6,483,708 B2 | * | 11/2002 | Ali et al. ..................... | 361/719 |

FOREIGN PATENT DOCUMENTS

JP         407273480 A    * 10/1995           H05K/7/20

* cited by examiner

*Primary Examiner*—Michael Datskovskiy
(74) *Attorney, Agent, or Firm*—Paul E. Steiner

(57) ABSTRACT

Some disclosed embodiments include a retention apparatus having a unidirectional locking member, the unidirectional locking member defining a bore therethrough, a post disposed through the bore of the unidirectional locking member, wherein the post is adapted to be secured to a support base, and a spring adapted to bias the unidirectional locking member against a device to be retained, wherein the unidirectional locking member is adapted to allow movement of the device in a first direction and to inhibit movement of the device in a second direction opposite to the first direction. The retention apparatus may be used to maintain contact between a heatsink and a processor on a motherboard. Other embodiments are disclosed and claimed.

22 Claims, 8 Drawing Sheets

HEATSINK RETENTION APPARATUS

BACKGROUND AND RELATED ART

Thermal dissipation devices are utilized in a wide variety of applications, including electronic apparatus such as computers, stereos, televisions, or any other device that produces unwanted heat by inefficiencies in electronic circuits, such as integrated circuit chips (ICs), including microprocessors. Such devices generally employ conduction, convection, or a combination of conduction and convection to dissipate heat generated by a heat source. Conduction is the transfer of heat by the movement of heat energy from a high temperature region to a low temperature region in a body. Convection is the transfer of heat from the surface of a body by the circulation or movement of a liquid or gas over the surface. A heatsink is a thermal dissipation device, typically comprising a mass of material (generally metal) that is thermally coupled to a heat source and draws heat energy away from the heat source by conduction of the energy from a high-temperature region to a low-temperature region of the metal. The heat energy can then be dissipated from a surface of the heatsink to the atmosphere primarily by convection.

An integrated circuit may be closely associated with a heat transfer system that removes heat from the circuit. An integrated circuit die may be packaged and the package may be coupled to a heat transfer device. Alternatively, the die may be exposed for direct contact by the heat transfer device. Heat transfer components may be active or passive. For example, an active heat transfer component includes a fan which forces air over the integrated circuit to increase its rate of heat transfer. A passive heat transfer component includes a heatsink with desirable heat transfer characteristics. Combinations of active and passive heat transfer devices are commonly utilized in heat transfer systems.

The heatsink may be secured to a circuit board in a variety of manners including, for example, clips and screws. The retention mechanism is designed to satisfy several thermal and mechanical requirements. The heatsink should maintain a satisfactory thermal interface with the component. The retention mechanism should also be able to withstand shock and/or vibration as may be expected to occur for the particular application.

BRIEF DESCRIPTION OF THE DRAWINGS

Various features of the invention will be apparent from the following description of preferred embodiments as illustrated in the accompanying drawings, in which like reference numerals generally refer to the same parts throughout the drawings. The drawings are not necessarily to scale, the emphasis instead being placed upon illustrating the principles of the invention.

DESCRIPTION

Figure 1:
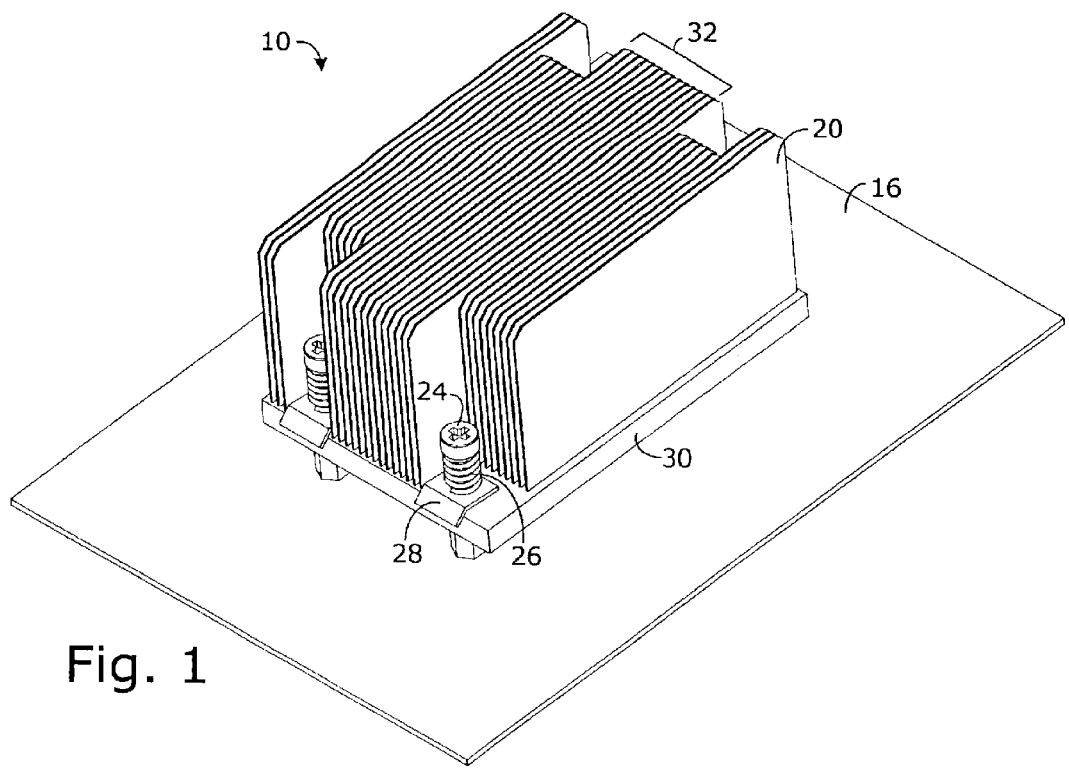
FIG. 1 is a perspective view of an example system utilizing a wedge lock retention mechanism in accordance with some embodiments of the invention.
Figure 2:
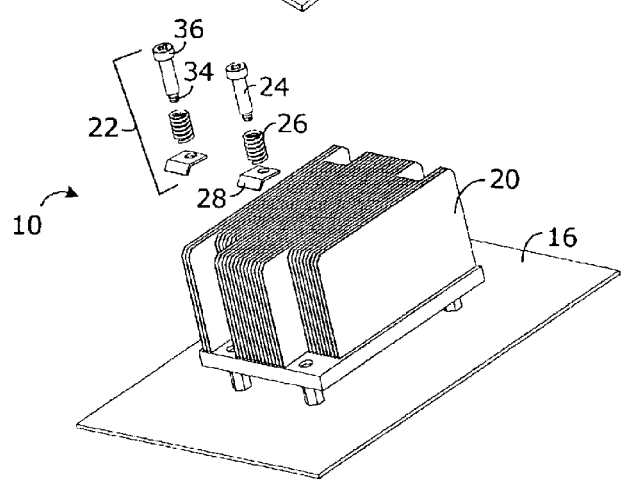
FIG. 2 is an exploded, perspective view of the example system from FIG. 1.
Figure 3:
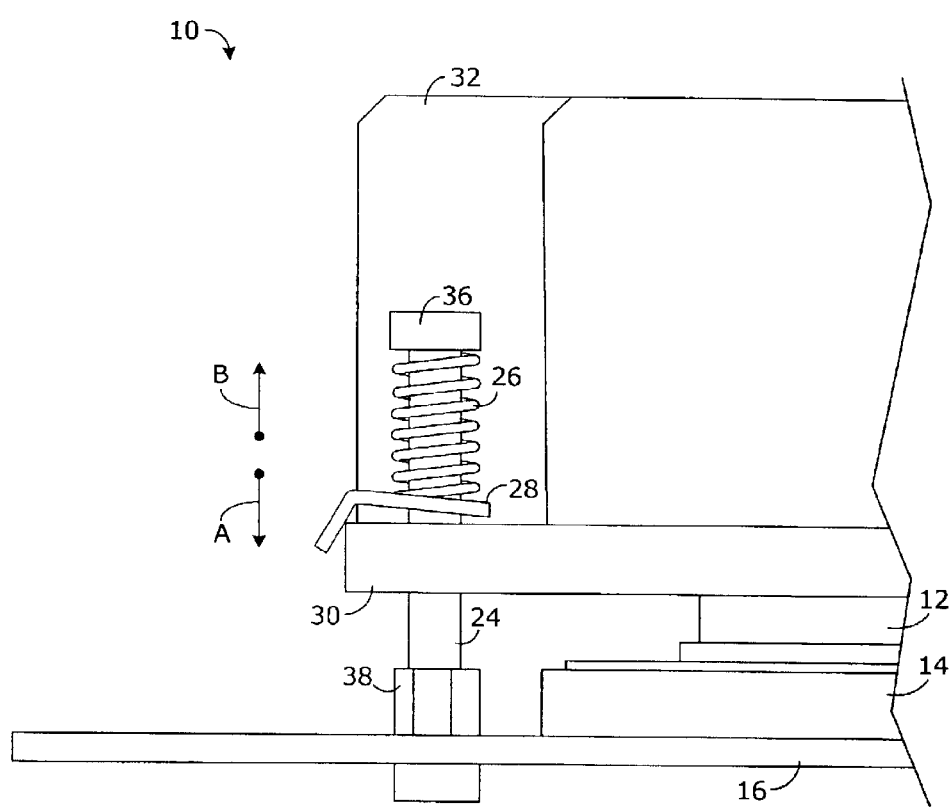
FIG. 3 is a schematic, side view of the example system from FIG. 1.
Figure 4:
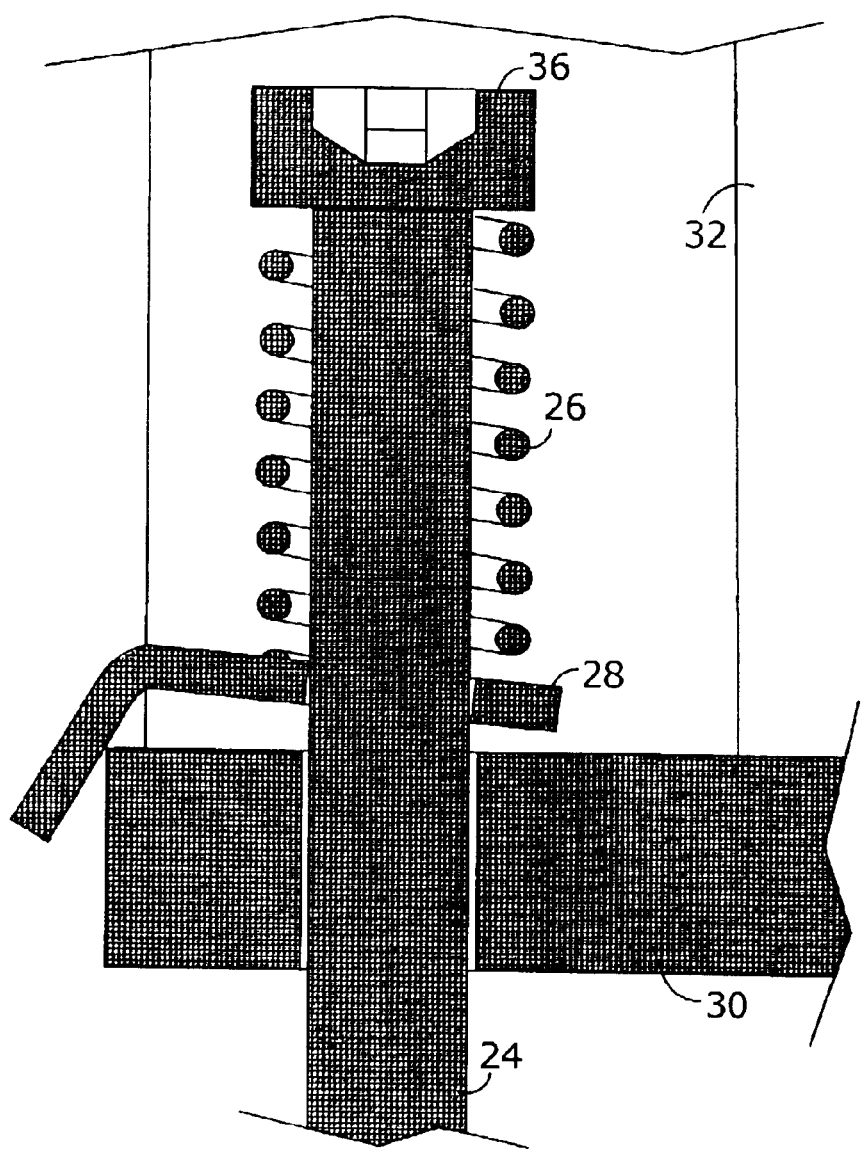
FIG. 4 is an enlarged, fragmented cross sectional view of the example system from FIG. 1.
Figure 5:
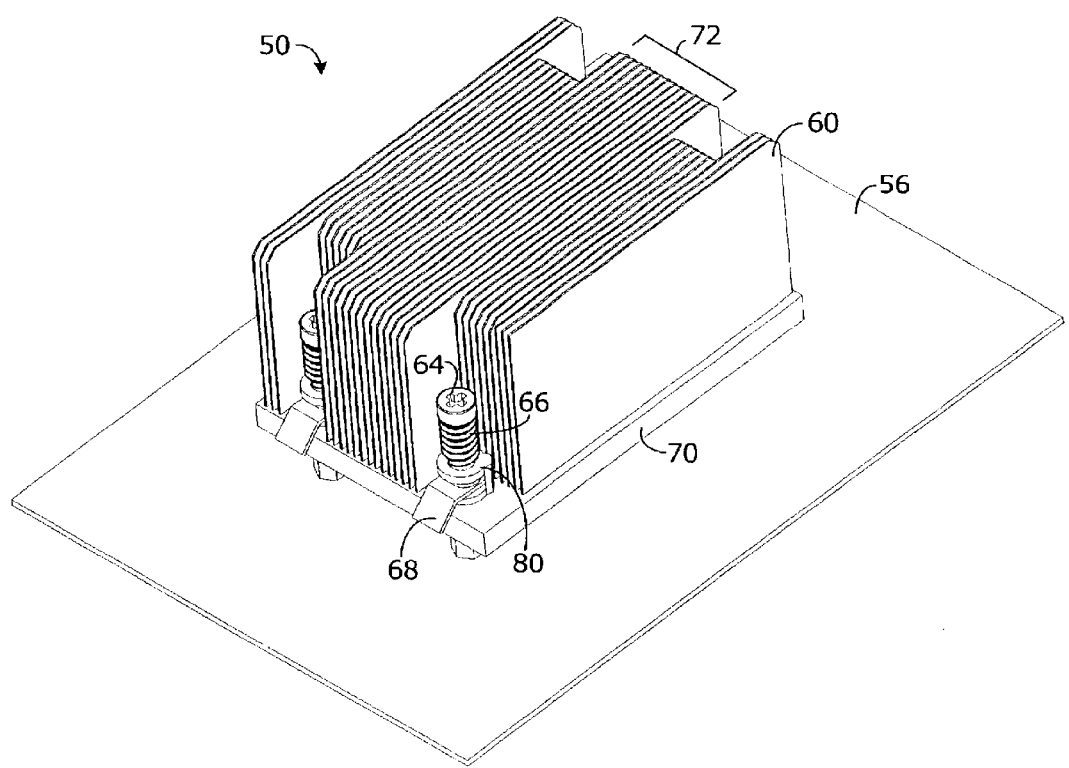
FIG. 5 is a perspective view of another example system utilizing a wedge lock retention mechanism in accordance with some embodiments of the invention.
Figure 6:
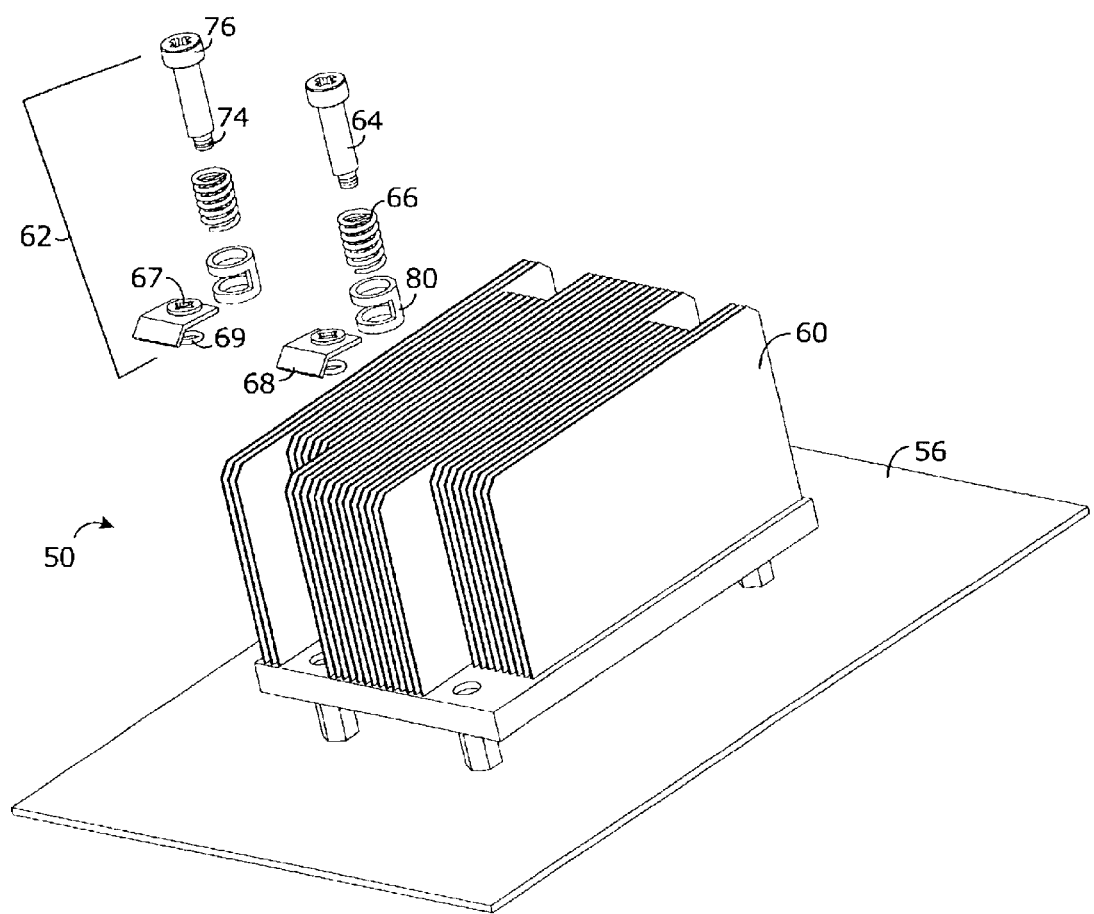
FIG. 6 is an exploded, perspective view of the example system from FIG. 5.
Figure 7:
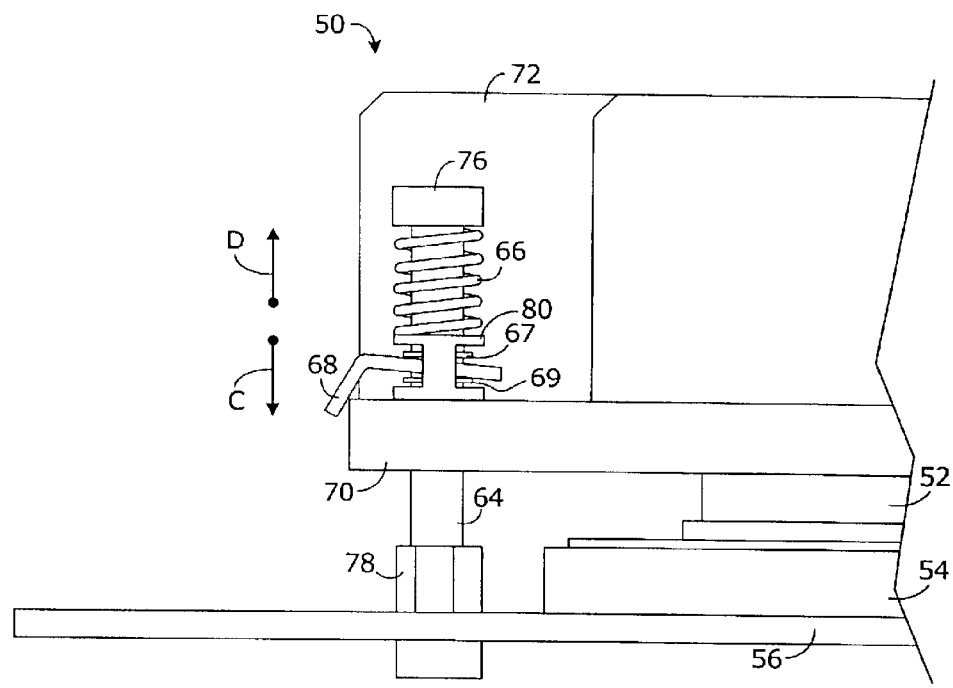
FIG. 7 is a schematic, side view of the example system from FIG. 5.

In the following description, for purposes of explanation and not limitation, specific details are set forth such as particular structures, architectures, interfaces, techniques, etc. in order to provide a thorough understanding of the various aspects of the invention. However, it will be apparent to those skilled in the art having the benefit of the present disclosure that the various aspects of the invention may be practiced in other examples that depart from the these specific details. In certain instances, descriptions of well known devices, circuits, and methods are omitted so as not to obscure the description of the present invention with unnecessary detail.

Referring to FIGS. 1–4, an electronic device 10 may include an integrated circuit 12 secured within a holder 14 which is in turn secured to a support base (e.g. a circuit board 16). For example, the holder 14 is a socket that defines a frame around the integrated circuit 12. Various portions of the holder 14 may be secured to the circuit board 16 (e.g. by a fastener). In some embodiments of the present invention, the device 10 is a motherboard and the integrated circuit 12 is a processor. As used herein, a motherboard refers to an entire assembly including a main circuit board, integrated circuits, heatsinks, fans, and other components mounted to the main circuit board. A heatsink 20 is positioned over the integrated circuit 12 and is in thermal contact with the integrated circuit 12. A retention mechanism 22 secures the heatsink 20 to the circuit board 16. The retention mechanism includes a post 24, a spring 26, and a unidirectional locking member 28.

In some examples, the integrated circuit 12 may include a die inside a package. In other examples, the die is exposed. In some examples, the heatsink 20 may be in direct contact with either the die or the package of the integrated circuit 12. However, it is not essential that the heatsink 20 directly contact the integrated circuit 12. For example, a thermally conductive material such as a gasket, thermal epoxy, or thermal grease may be disposed between the heatsink 20 and the integrated circuit 12.

In some embodiments, the device 10 may include a fan (not shown). While the heatsink 20 is shown as a fin type heatsink, any other heatsink design may be utilized including, for example, those that include pins. The heatsink 20 includes a base and fins 32 which may be constructed of any suitable materials, according to the requirements of the particular application. It is well known that metals provide good thermal transfer, as well as durability. Preferably, a metal such as copper is used because of its high thermal conductivity. Other materials such as aluminum, steel, ceramics, metal filled plastic, or various alloys of metal such as aluminum, zinc, or other thermally conductive materials can also be used for the heatsink 20.

The retention mechanism 22 is assembled as follows. The post 24 passes through the spring 26 and a bore in the unidirectional locking member 28. The post 24 is secured to the circuit board 16. For example, one end of the post 24 may include a threaded end 34 which is screwed into a standoff 38 on the circuit board 16. The other end of the post 24 includes a head 36 which retains the spring 26 on the post 24. The post 24 may be made of metal, plastic, or other suitable materials. The shaft of the post 24 is generally smooth, but may be roughened to increase friction with the member 28. The spring 26 provides a force against the unidirectional locking member 28. In some embodiments, the member 28 is an angled member (e.g. an L-shaped member) with a bore through one leg of the member. The other leg of the member 28 is angled toward the heatsink 20 and contacts the heatsink 20 at a corner of the heatsink 20 (see FIG. 3). The member 28 may be made of metal, plastic, or other suitable materials. The member 28 can slide easily along the shaft of the post 24 in the direction of arrow A but becomes wedged on the post 24 if force is applied to the member 28 in the opposite direction. In this configuration, the heatsink 20 can easily move in the direction of arrow A in FIG. 3, namely, closer to the circuit board 16. When a force is applied to the heatsink 20 in the direction of arrow B (e.g. away from the board), the unidirectional locking member 28 binds against the post 24 and movement away from the circuit board 16 is inhibited. Accordingly, the unidirectional locking member 28 allows load transfer and movement in one direction and inhibits translation of the heatsink 20 in the other direction along the post 24.

In the present example, the spring 26 is a coil type spring and the unidirectional locking member 28 is a wedge lock. However, the invention is not limited to these specific parts. Other types of springs or resilient members may be utilized to force (e.g. bias) the heatsink 20 against the integrated circuit 12, with corresponding changes to the retention mechanism to utilize the different springs. The spring may be made of metal, plastic, or other suitable materials. Other unidirectional locking members such as a ratcheting locking member may be utilized in place of the wedge lock. The post 24 is shown in the present example as having a circular cross section. However, other cross section shapes may be utilized including, without limitation, square or rectangular. Generally, the shape of the bore in the unidirectional locking member 28 will correspond to the shape of the post 24.

In order to maintain a satisfactory thermal interface, the heatsink is held against the integrated circuit 12 with a first desired amount of force (e.g. 50 Newtons). However, to withstand transient mechanical environmental loading events, the heatsink is secured with a second desired amount of force (e.g. 500 Newtons). With conventional retention mechanisms such as clips or screws, only a single retention force is supplied. For example, if a clip is utilized to provide the desired force for the thermal interface, a transient may cause the clip to fail. If a stronger clip is utilized to resist the transient event, the force of the clip may crush the integrated circuit. A trade-off may be made by making the integrated circuit package stronger (increasing cost) or the clip weaker (compromising reliability). In the case of screws or bolts, it is difficult to achieve uniform thermal contact because each screw must be tightened individually and may have varying amounts of torque applied.

Advantageously, the present invention separates the thermal interface requirement from the transient event require-ment. The spring 26 provides the desired force required for the thermal interface requirements. The wedge lock 28 provides the desired force required for transient events (e.g. shock and/or vibration).

The spring force is transferred from the spring 26 to the heatsink 20 through the member 28 at the contact point on the corner edge of the heatsink 20. Within the tolerance of the spring 26, the force applied to meet the thermal interface requirement is substantially uniform at each retention point. Because the spring 26 does not have to account for transient events, springs having lower spring rates (e.g. lighter and less costly springs) may be utilized.

In FIG. 1, the device 10 utilizes four such retention mechanisms 22 (two not shown). However, other examples may utilize one or more of the retention mechanism 22. For example, a small cost savings is provided by omitting the wedge lock on two diagonally opposite corners such that all four retention points utilize the spring 26 to meet the thermal interface requirements while only two retention points include the unidirectional locking member 28 to meet the transient requirements.

Some embodiments of the invention may be particularly advantageous for the retention of heavier heatsinks (e.g. greater than 0.5 kg). Heavier heatsinks are desirable to provide satisfactory thermal dissipation using air-cooling techniques (e.g. as opposed to more complex and costly liquid cooling). However, heavier heatsinks are more difficult to retain when subject to shock and vibration. It is difficult for conventional heatsinks to meet the transient event requirements without overloading the thermal interface requirements (and possibly damaging the integrated circuit). Because some embodiments of the invention separate the thermal interface requirements from the transient event requirements, the unidirectional locking member provides sufficient retention force for a heavier heatsink, even when subject to shock and vibration, without overloading the thermal interface requirements (which is met by the spring force).

Some embodiments of the invention provide advantages during the manufacturing and assembly process. The heatsink 20 and retention mechanism 22 may be provided as a captive assembly which is attached to the circuit board 16 as a single part. For example, prior to assembly of the circuit board 16, the post 24 may be inserted through the spring 26, the member 28, and the base 30 of the heatsink 20. A nut or lock washer may then be screwed onto the threaded end 34 of the post 24 while leaving a sufficient portion of the threaded end 34 open for attachment to the standoff 38 on the circuit board 16.

Some embodiments of the invention provide an advantage in that the retention mechanism is adjustable in height. Because the post 24 slides through the locking member 28 in the direction of arrow A, the retention mechanism is tolerant of variations in the height of the integrated circuit 12. Taller packages may cause the spring 26 to compress more than shorter packages, but the spring force varies only slightly over a range of compression. The thermal interface material (e.g. non-limiting examples include thermal grease or phase change material) typically specifies a minimum pressure load for activation and/or recommended use. The thermal interface force thus is generally the lower limit load specification for the retention system while the upper limit is generally determined by the amount of force tolerated by the integrated circuit 12 or the holder 14. Because some embodiments of the invention provide separate load paths (e.g. locking member 28 in direction B and spring 26 in direction A), one spring 26 accommodates a relatively large variation or tolerance in the height of the integrated circuit 12 while maintaining compression loads that are well within the upper and lower load specifications for the integrated circuit 12 and thermal interface material.

Beyond manufacturing tolerances for a particular integrated circuit, some embodiments of the invention may provide the advantage that a single heatsink/retention mechanism assembly may be utilized for a variety of integrated circuits (e.g. a family of processors) having different package heights. The overall height of the integrated circuit with respect to the circuit board includes the entire stack of the holder (e.g. the socket), the integrated circuit and any other parts packaged therewith. Depending on the tolerance band for the variety of packages, a single spring may meet the thermal interface requirements for two or more stacks with different overall stack heights.

Some embodiments of the invention may provide manufacturing advantages in terms of economy of scale. For example, even if the spring has to be changed to meet the particular thermal interface requirements of a particular integrated circuit, the heatsink, post, and/or locking member may be the same over a wide range of integrated circuit package heights. Accordingly, the manufacturing volumes for these parts may be higher.

With reference to FIGS. 5–10, an electronic device 50 is similar to the device 10, except that a retention mechanism 62 includes an optional straddle member 80. The spring force transfers through the intermediary straddle member 80. The straddle member 80 loads the heat sink 60 directly without contacting the unidirectional locking member 68.

The device 50 may include an integrated circuit 52 secured within a holder 54 which is in turn secured to a circuit board 56. For example, the holder 54 is a socket adapted to receive the integrated circuit 52. Various portions of the holder 54 may be secured to the circuit board 56 (e.g. by a fastener). In some embodiments of the present invention, the device 50 is a motherboard and the integrated circuit 52 is a processor. The heatsink 60 is positioned over the integrated circuit 52 and is in thermal contact with the integrated circuit 52. A retention mechanism 62 secures the heatsink 60 to the circuit board 56. The retention mechanism includes a post 64, a spring 66, the straddle member 80, and the unidirectional locking member 68 (and associated resilient members 67 and 69).

As noted above, the integrated circuit 52 may include a die inside a package or the die may be exposed. The heatsink 60 may be in direct contact with either the die or the package of the integrated circuit 52 or a thermally conductive material such as a gasket, thermal epoxy, or thermal grease may be disposed between the heatsink 60 and the integrated circuit 52. The device 50 may include an optional fan (not shown) and other heatsink designs may be utilized including those that include pins. The heatsink 60 includes a base 70 and fins 72 which may be constructed of any suitable materials, according to the requirements of the particular application. Preferably, a metal such as copper is used because of its high thermal conductivity. Other thermally conductive materials can also be used for the heatsink 60.

The retention mechanism 62 is assembled as follows. The post 64 passes through the spring 66, the straddle member 80, and respective bores in the resilient member 67, the unidirectional locking member 68, and the resilient member 69. The post 64 is secured to the circuit board 56. For example, one end of the post 64 may include a threaded end 74 which is screwed into a standoff 78 on the circuit board 56. The other end of the post 64 includes a head 76 which retains the spring 66 on the post 64. The spring 66 provides a bias against the straddle member 80. The spring force is transferred from the spring 66 to the heatsink 60 by the straddle member 80.

Figure 8:
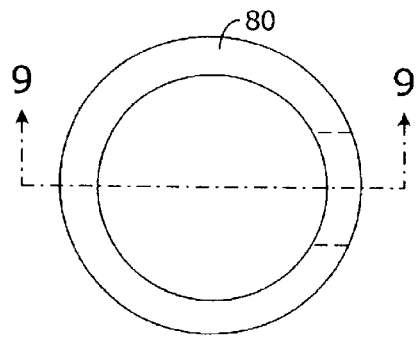
FIG. 8 is a schematic, top view of a straddle component in accordance with some embodiments of the invention.
Figure 9:
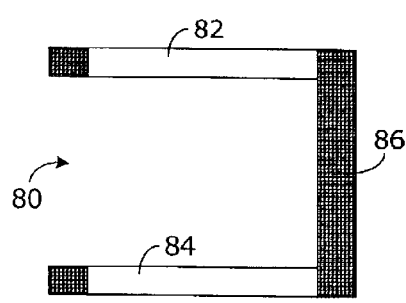
FIG. 9 is a cross sectional view taken along line 9—9 in FIG. 8.
Figure 10:
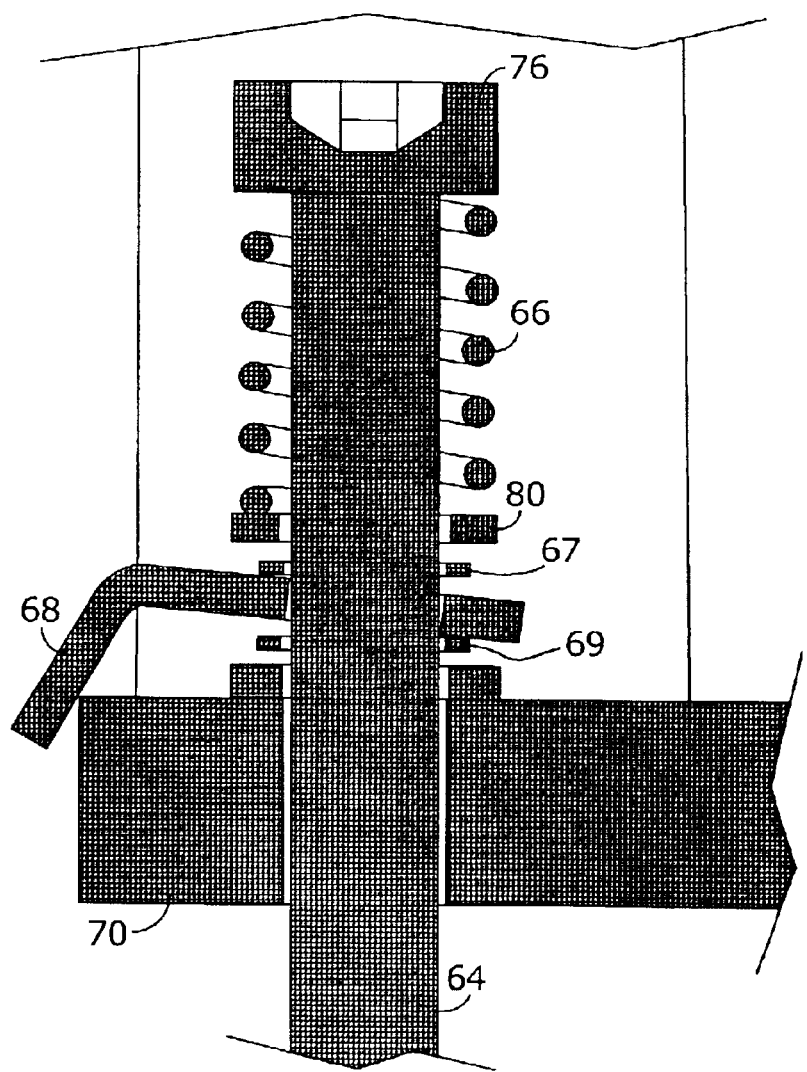
FIG. 10 is an enlarged, fragmented cross sectional view of the example system from FIG. 5.

With reference to FIGS. 8–9, in some embodiments the straddle member 80 includes two rings 82 and 84 connected to opposite ends of a support 86. More than one support 86 may be provided so long as clearance is provided for the unidirectional locking member 68. The bore of the rings 82 and 84 is large enough to accept the post 64 and may be large enough to accommodate the resilient members 67 and/or 69. Alternatively, the bore of the rings may be smaller than the outside diameter of the resilient members 67 and/or 69 to prevent those members from sliding along the post 64 past the straddle member 80. With the locking member 68 positioned in between the two rings 82 and 84, the straddle member 80 provides a contact surface on both sides of the locking member 68 and accordingly may be said to straddle the locking member 68. A spring force applied to the ring 82 is transferred to the other ring 84 through the support 86 without disturbing the locking member 68.

In some embodiments, the member 68 is an angled member as described above and contacts the heatsink 60 at a corner edge of the heatsink 60 (see FIG. 7) or on the top surface of the base 70. The member 68 can slide easily along the shaft of the post 64 in the direction of arrow C but becomes wedged on the post 64 if force is applied to the member 68 in the opposite direction. In this configuration, the heatsink 60 can easily move in the direction of arrow C in FIG. 7, namely, closer to the circuit board 56. When a force is applied to the heatsink 20 in the direction of arrow D (e.g. away from the board), the unidirectional locking member 68 binds against the post 64 and movement away from the circuit board 66 is inhibited. Accordingly, the unidirectional locking member 68 allows load transfer and movement in one direction and inhibits translation of the heatsink 60 in the other direction along the post 64.

The example described above in connection with FIGS. 1–4 works well with a stiff circuit board that yields little relative movement during a transient event loading in the direction of the spring force (i.e. arrow A). However, a more flexible circuit board may allow translation of the heatsink closer to the circuit board during such a transient event. Because the wedge lock slides easily in the direction of arrow A, the movement of the heatsink closer to the circuit board may be captured by the wedge lock under the higher loading condition of the transient event and potentially retain an overload condition of the heatsink on the package. Some embodiments of the invention overcome this problem with the straddle member 80 and two resilient members 67 and 69.

The resilient member 67 lightly presses on the unidirectional locking member 68 to ensure that the member 68 maintains contact and proper position with respect to the heat sink 60. However, the member 68 transmits very little load to the heat sink 60 itself (most of the load goes through the straddle member 80). For example, the resilient member 67 may be a light spring or a foam (e.g. Poron) gasket or washer. A steady pressure will slide the resilient member 69 along the post 64 (e.g. so that the heatsink 60 and locking member 68 can be positioned with a desired amount of pressure). However, the resilient member 69 provides viscous damping to inhibit the unidirectional locking member 68 from sliding along the shaft of the post 64 during a transient loading event in the direction of arrow C. For example, the resilient member 69 may be a rubber washer or o-ring. A good performing design for both assembly and shock retention utilizes a balance in the selection of the stiffness of the resilient member 67 and the damping characteristics of the resilient member 69. Although it is preferred in some embodiments that both resilient members 67 and 69 be used, other embodiments may utilize one or the other of the resilient members together with the straddle. Other alternative embodiments includes the use of only the resilient member 69 together with the retention mechanism 22 (e.g. without the straddle).

The present example of FIGS. 5–10 provides the advantages mentioned above in connection with FIGS. 1–4, with the additional advantage of reducing the possibility of an overload condition. Also, the post, spring, wedge-lock, and optional straddle and resilient members may be provided as a captive sub-assembly prior to installation on the heat sink. During assembly of the device 50, the heatsink 60 and retention mechanism 62 may be provided as a unitary assembly which is installed by screwing the threaded ends 74 of the posts 64 into the standoffs 78 on the circuit board 56.

Figure 11:
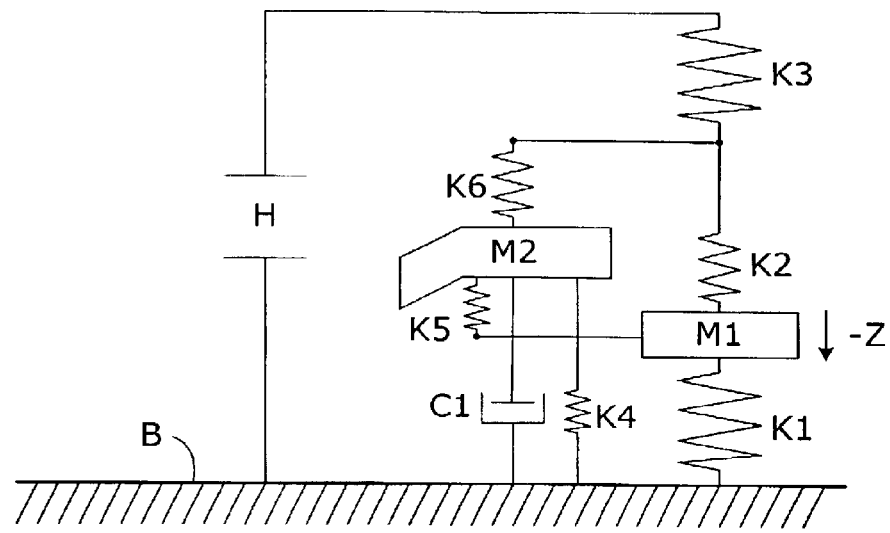
FIG. 11 is a schematic diagram illustrative of operation of some embodiments of the invention under a first operating condition.

With reference to FIG. 11, a schematic diagram represents a dynamic model showing operation of some embodiments of the present invention during a static compression and downward (e.g. direction C in FIG. 7) shock loading event. This simplified dynamic model is used calculate the loads, deflection and resulting motion (or lack thereof) during the static spring compressions and transient shock loading events.

For purposes of simplification, most elements of the dynamic model are represented by a spring (K) or a mass element (M). A support base B corresponds, for example, to the circuit board 56. A mass M1 corresponds, for example, to the mass of the heatsink 60. A mass M2 corresponds, for example, to the mass of the locking member 68. A spring K1 represents the stiffness of the base B (for example, K1 corresponds to the stiffness of the circuit board for a motherboard assembly). A spring K2 represents the stiffness of the straddle (e.g. straddle member 80). A spring K3 corresponds, for example, to the spring 66. An element C1 corresponds, for example, to the resilient member 69, with the spring K4 representing the spring stiffness of the element C1. A spring K5 represents the stiffness of the locking member 68. A spring K6 corresponds, for example, to the resilient member 67. Element H corresponds to an enforce displacement applied to the entire stack of components.

In operation, the enforce displacement H causes the whole system to compress upon, for example, an integrated circuit mounted on the base B. The stiffness K1 of the base B is an important element which provides resistance to the loading of the integrated circuit during normal static and transient loading events. An enforced displacement H will cause the retention mechanism (i.e. mass M2 and springs K4–K6, etc.) to become loaded and if the base B does flex, this flexing causes mass M1 to translate and interact with the retention mechanism loading, the overall system loading, and the positional placement. Additionally, in this dynamic model, the spring K6 transfers part of the compressive load of the spring K3 to force the mass M1 to move in the −Z direction. Also represented is the damper mechanism C1, K4 which inhibits the mass M1 from moving any significant distance during a shock or over compressive condition in the −Z direction. In other words, the damper mechanism helps to maintain the locking member 68 position and desired compressive load and inhibits the locking member 68 from retaining a higher load during a transient overload condition.

Figure 12:
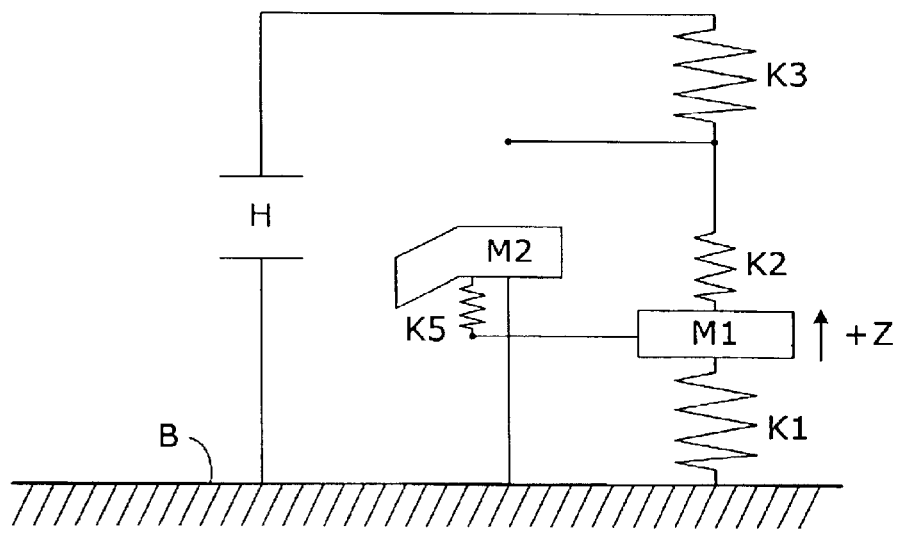
FIG. 12 is a schematic diagram illustrative of operation of some embodiments of the invention under a second operating condition.

With reference to FIG. 12, a schematic diagram represents a dynamic model showing operation of some embodiments of the present invention during a static compression and upward (e.g. direction D in FIG. 7) shock loading event. Elements B, K1–K3, K5, M1–2, and H refer to the same elements described above.

During the loading event, the mass M1 translates (and may accelerate) in the +Z direction. The motion of the mass M1 compresses the spring K2 (e.g. the straddle member 80) and the spring K3 and unloads the base B. However, the movement of the mass M1 also compresses the spring K5 (e.g. locking member 68 having a high stiffness) thus transferring the loads through the mass M2 (e.g. causing the locking member 68 to wedge against the post 64 stopping further motion of the heatsink 60).

One skilled in the art may utilize the foregoing dynamic models to analyze a trade-off between (1) the shape and designed stiffness of the resilient member 67 which affects the desired position of the locking member 68 relative to the heatsink 60 and (2) the characteristics of the resilient member 69 which inhibits movement of the locking member 68 during the −Z transient event. Similarly, this model may be used to design and then analyze the spring stiffness, damping and mass characteristics of all the elements in the modeled system.

Although the foregoing examples describe a particular utility of retaining heatsinks to circuit boards in electronic systems, some embodiments of the invention may also find more general utility in retaining other types of devices to other types of support bases in other electronic or mechanical systems.

The foregoing and other aspects of the invention are achieved individually and in combination. The invention should not be construed as requiring two or more of the such aspects unless expressly required by a particular claim. Moreover, while the invention has been described in connection with what is presently considered to be the preferred examples, it is to be understood that the invention is not limited to the disclosed examples, but on the contrary, is intended to cover various modifications and equivalent arrangements included within the spirit and the scope of the invention.

What is claimed is:

1. A retention apparatus, comprising:
a unidirectional locking member, the unidirectional locking member defining a bore therethrough;
a post disposed through the bore of the unidirectional locking member, wherein the post is adapted to be secured to a support base; and
a spring contacting the unidirectional locking member and adapted to bias the unidirectional locking member against a device to be retained,
wherein the unidirectional locking member is adapted to allow movement of the device in a first direction and to inhibit movement of the device in a second direction opposite to the first direction.

2. A retention apparatus, comprising:
a unidirectional locking member, the unidirectional locking member defining a bore therethrough;
a post disposed through the bore of the unidirectional locking member, wherein the post is adapted to be secured to a support base; and
a spring adapted to bias the unidirectional locking member against a device to be retained,
wherein the unidirectional locking member is adapted to allow movement of the device in a first direction and to inhibit movement of the device in a second direction opposite to the first direction, and wherein the unidirectional locking member comprises an angled member adapted to wedge against the post when a force is applied to the device in the second direction.

3. The retention apparatus as recited in claim 1, wherein the spring comprises a coil spring and wherein the spring is disposed around the post.

4. The retention apparatus as recited in claim 1, further comprising a resilient member defining a bore therethrough, wherein the post is disposed through the bore of the resilient member and wherein the resilient member is positioned to inhibit movement of the unidirectional locking member in the first direction.

5. A retention apparatus, comprising:
   a unidirectional locking member, the unidirectional locking member defining a bore therethrough;
   a cost disposed through the bore of the unidirectional locking member, wherein the post is adapted to be secured to a support base;
   a resilient member adapted to bias the unidirectional locking member against a device to be retained, wherein the unidirectional locking member is adapted to allow movement of the device in a first direction and to inhibit movement of the device in a second direction opposite to the first direction;
   a straddle member positioned to straddle the unidirectional locking member; and
   a spring adapted to bias the straddle member against the device with a relatively higher bias as compared to a bias of the resilient member.

6. The apparatus as recited in claim 5, wherein the resilient member defines a bore therethrough and wherein the post is disposed through the bore of the resilient member.

7. The retention apparatus as recited in claim 5, further comprising a second resilient member defining a bore therethrough, wherein the post is disposed through the bore of the second resilient member and wherein the second resilient member is positioned to inhibit movement of the unidirectional locking member in the first direction.

8. A thermal dissipation apparatus, comprising:
   a unidirectional locking member, the unidirectional locking member defining a bore therethrough;
   a post disposed through the bore of the unidirectional locking member, wherein the post is adapted to be secured to a circuit board;
   a thermal transfer device; and
   a spring contacting the unidirectional locking member and adapted to bias the unidirectional locking member against the thermal transfer device,
   wherein the unidirectional locking member is adapted to allow movement of the thermal transfer device in a first direction and to inhibit movement of the thermal transfer device in a second direction opposite to the first direction.

9. The thermal dissipation apparatus as recited in claim 8, wherein the unidirectional locking member comprises an angled member adapted to wedge against the post when a force is applied to the thermal transfer device in the second direction.

10. The thermal dissipation apparatus as recited in claim 8, wherein the spring comprises a coil spring and wherein the spring is disposed around the post.

11. The thermal dissipation apparatus as recited in claim 8, further comprising a resilient member defining a bore therethrough, wherein the post is disposed through the bore of the resilient member and wherein the resilient member is positioned to inhibit movement of the unidirectional locking member in the first direction.

12. A thermal dissipation apparatus, comprising:
   a unidirectional locking member, the unidirectional locking member defining a bore therethrough;
   a post disposed through the bore of the unidirectional locking member, wherein the post is adapted to be secured to a circuit board;
   a thermal transfer device;
   a resilient member adapted to bias the unidirectional locking member against the thermal transfer device, wherein the unidirectional locking member is adapted to allow movement of the thermal transfer device in a first direction and to inhibit movement of the thermal transfer device in a second direction opposite to the first direction;
   a straddle member positioned to straddle the unidirectional locking member, and
   a spring adapted to bias the straddle member against the thermal transfer device with a relatively higher bias as compared to a bias of the resilient member.

13. The thermal dissipation apparatus as recited in claim 12, wherein the resilient member defines a bore therethrough and wherein the post is disposed through the bore of the resilient member.

14. The thermal dissipation apparatus as recited in claim 12, further comprising a second resilient member defining a bore therethrough, wherein the post is disposed through the bore of the second resilient member and wherein the second resilient member is positioned to inhibit movement of the unidirectional locking member in the first direction.

15. An electronic system, comprising:
   a circuit board;
   an integrated circuit disposed on the circuit board;
   a heatsink positioned in thermal contact with the integrated circuit; and
   a retention apparatus adapted to maintain the heatsink in contact with the integrated circuit, the retention apparatus comprising:
      a unidirectional locking member, the unidirectional locking member defining a bore therethrough;
      a post disposed through the bore of the unidirectional locking member, wherein the post is secured to the circuit board; and
      a spring contacting the unidirectional locking member and adapted to bias the unidirectional locking member against the heatsink,
      wherein the unidirectional locking member is adapted to allow movement of the heatsink in a first direction and to inhibit movement of the heatsink in a second direction opposite to the first direction.

16. The electronic system as recited in claim 15, wherein the unidirectional locking member comprises an angled member adapted to wedge against the post when a force is applied to the heatsink in the second direction.

17. The electronic system as recited in claim 15, wherein the spring comprises a coil spring and wherein the spring is disposed around the post.

18. The electronic system as recited in claim 15, further comprising a resilient member defining a bore therethrough, wherein the post is disposed through the bore of the resilient member and wherein the resilient member is positioned to inhibit movement of the unidirectional locking member in the first direction.

19. An electronic system, comprising:

a circuit board;

an integrated circuit disposed on the circuit board;

a heatsink positioned in thermal contact with the integrated circuit; and a retention apparatus adapted to maintain the heatsink in contact with the integrated circuit, the retention apparatus comprising:

a unidirectional locking member, the unidirectional locking member defining a bore therethrough;

a post disposed through the bore of the unidirectional locking member, wherein the post is secured to the circuit board;

a resilient member adapted to bias the unidirectional locking member against the heatsink, wherein the unidirectional locking member is adapted to allow movement of the heatsink in a first direction and to inhibit movement of the heatsink in a second direction opposite to the first direction;

comprising:

a straddle member positioned to straddle the unidirectional locking member; and a second spring adapted to bias the straddle member against the thermal transfer device with a relatively higher bias as compared to a bias of the resilient member.

20. The electronic system as recited in claim 19, wherein the resilient member defines a bore therethrough and wherein the post is disposed through the bore of the resilient member.

21. The electronic system as recited in claim 19, further comprising a second resilient member defining a bore therethrough, wherein the post is disposed through the bore of the second resilient member and wherein the second resilient member is positioned to inhibit movement of the unidirectional locking member in the first direction.

22. The electronic system as recited in claim 15, wherein the heatsink includes a base defining a plurality of bores, the electronic system includes a corresponding retention apparatus for at least two of the plurality of bores in the base of the heatsink, and wherein the post of each corresponding retention apparatus is disposed through the bore in the base of the heatsink.

* * * * *